United States Patent [19]
Dao et al.

[11] Patent Number: 5,354,632
[45] Date of Patent: Oct. 11, 1994

[54] LITHOGRAPHY USING A PHASE-SHIFTING RETICLE WITH REDUCED TRANSMITTANCE

[75] Inventors: Giang T. Dao, Fremont; Kenny K. H. Toh, Sunnyvale; Eng T. Gaw, San Jose; Rajeev R. Singh, Santa Clara, all of

[73] Assignee: Intel Corporation, Santa Clara, Calif.

[21] Appl. No.: 869,026

[22] Filed: Apr. 15, 1992

[51] Int. Cl.$^5$ .......................... G03F 9/00; G03F 9/02
[52] U.S. Cl. ...................................... 430/5; 430/325; 430/326
[58] Field of Search ............................................ 430/5

[56] References Cited

U.S. PATENT DOCUMENTS 4,890,309  12/1989  Smith et al. ........................ 378/35

FOREIGN PATENT DOCUMENTS 0383534  8/1990  European Pat. Off. ................ 430/5
2140743  5/1990  Japan .

Primary Examiner—John Kight, III
Assistant Examiner—R. F. Johnson
Attorney, Agent, or Firm—Blakely, Sokoloff, Taylor & Zafman

[57] ABSTRACT

A reticle and method of forming a patterned resist layer on a semiconductor substrate using the reticle is described. The substrate is coated with a resist layer. The resist layer is selectively exposed to a radiation wave having a wavelength that is transmitted through the reticle. The reticle includes at least one first, second, and third areas. The first area has a first transmittance. The second area is adjacent to the first area and has a second transmittance that is less than the first transmittance. The second area shifts radiation transmitted through the second area approximately 180° out of phase relative to radiation transmitted through the first area. The third area is adjacent to the second area. The third area is substantially opaque to prevent virtually any transmission of radiation. The resist layer is developed to form the patterned resist layer including at least one resist layer opening and at least one resist element.

30 Claims, 7 Drawing Sheets

FIG _1

FIG_2 (PRIOR ART)

FIG_3A (PRIOR ART)

FIG_4

FIG_5

FIG_8

FIG_9

FIG_10

FIG_11

FIG_12

FIG_13

LITHOGRAPHY USING A PHASE-SHIFTING RETICLE WITH REDUCED TRANSMITTANCE

FIELD OF THE INVENTION

The present invention relates to the field of semiconductor devices, and in particular, to the formation of a patterned resist layer using a phase-shifting reticle.

BACKGROUND OF THE INVENTION

Within the semiconductor industry, lithographic printers with reticles (also called masks) having device patterns have been used to pattern photoresist layers for several years. State of the an semiconductor devices require very small dimensional patterns. The patterns may be formed within a photoresist layer, as long as a reticle pattern can be resolved within the photoresist layer. The resolution limit, which is herein defined as the smallest dimension that can be resolved within the photoresist layer while maintaining an acceptable process window, is about:

$$k_1 \frac{\lambda}{NA}$$

where $k_1$ is a "constant" for a given lithographic process (process constant), $\lambda$ is the wavelength of the radiation, and NA is the numerical aperture of the lens. One skilled in the an appreciates that $k_1$ is not a true constant, but can actually vary. A conventional reticle has chrome elements and openings between the chrome elements. A conventional reticle has a $k_1$ of about 0.8. The resolution limit using a conventional reticle is hereinafter called the conventional resolution limit and is about 0.8 $\lambda$/NA. When $\lambda$ is about 365 nm and NA is about 0.54, the conventional resolution limit is about 0.54 $\mu$m.

Figure 2:
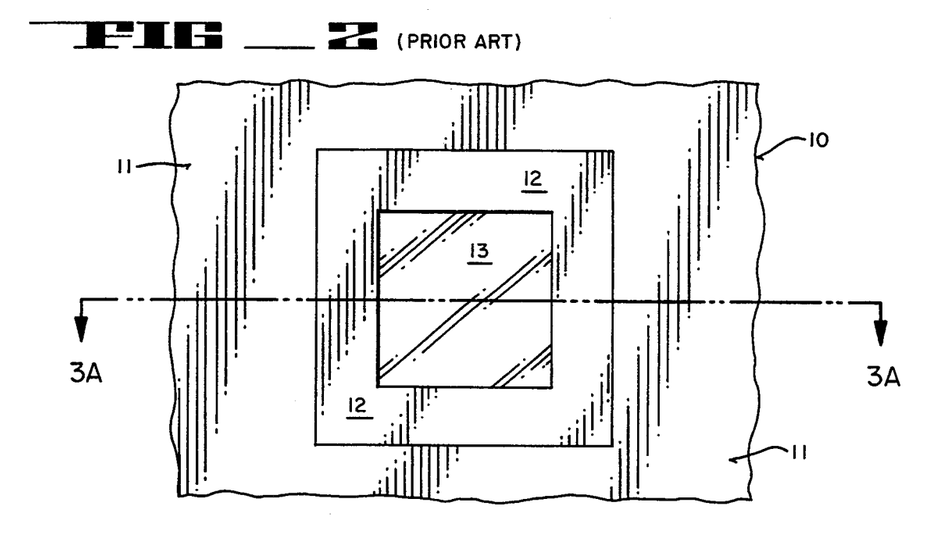
FIG. 2 includes an illustration of a top view of a portion of a prior art reticle.

A phase-shifting reticle may include chrome elements, phase-shifting elements, and reticle openings, which are areas between both the chrome elements and the phase-shifting elements. A typical prior m phase-shifting reticle is shown in FIG. 2 and includes a chrome element 11, a phase-shifting rim 12, and a reticle opening 13. A phase-shifting rim is a type of phase-shifting element. The reticle is discussed in more detail below. The transmittance of radiation transmitted through the phase-shifting rim 12 is about the same as the transmittance of radiation transmitted through the reticle opening 13.

Figure 1:
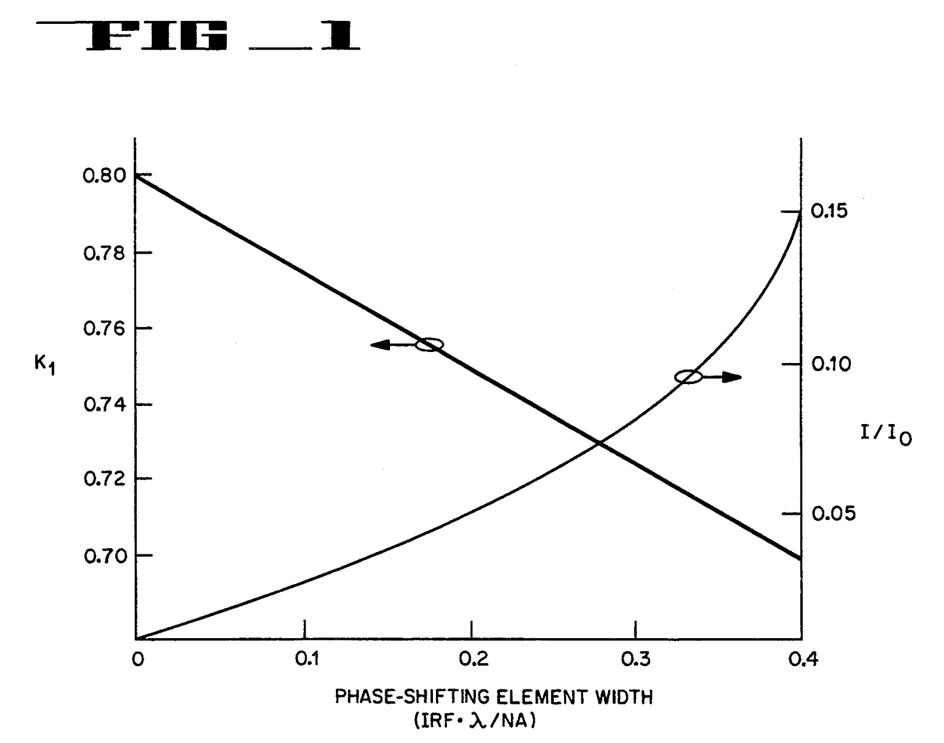
FIG. 1 includes a diagram of phase-shifting element width versus process constant and $I/I_O$ beneath the center of the phase-shifting element.

Within this application, a phase-shifting element width is sometimes expressed as a fraction of IRF·$\lambda$/NA where IRF is the image reduction factor of the lens, $\lambda$ is the wavelength of the radiation, and NA is the numerical aperture of the lens. Widths expressed in units of IRF·$\lambda$/NA are used because the actual width of a phase-shifting element varies based on those three parameters. The process constant, $k_1$, decreases as the width of the phase-shifting element increases. Although $k_1$ is a function of the phase-shifting element width, an equation to determine $k_1$ given a phase-shifting element width is not known. FIG. 1 generally illustrates that $k_1$ decreases as the phase-shifting element width increases, but it is understood that $k_1$ may not be a linear function of the phase-shifting element width. When the prior art phase-shifting reticle has a phase-shifting element with a width greater than about 0.4 IRF·$\lambda$/NA, the phase-shifting element is too wide, and the photoresist layer under the center of the phase-shifting element is substantially exposed when the reticle is exposed to radiation. The phase-shifting element width is usually no less than about 0.1 IRF·$\lambda$/NA because $k_1$ for a phase-shifting element width less than 0.1 IRF·$\lambda$/NA is close to the same value as $k_1$ for the conventional reticle. If the phase-shifting element width is about 0.4 IRF·$\lambda$/NA, $k_1$ is about 0.7, and the resolution limit is about 0.47 $\mu$m when $\lambda$ is about 365 nm, and NA is about 0.54. The resolution limit is about 13% less than the conventional resolution limit for the same $\lambda$ and NA.

As the phase-shifting element width increases, at least one process complication occurs. The radiation intensity at the photoresist layer surface under the center of the phase-shifting element increases as the phase-shifting element width increases as shown in FIG. 1. As used in this patent application hereinafter, I is the radiation intensity at a point on a resist layer surface beneath the reticle, and $I_O$ is the radiation intensity incident onto the reticle when the reticle is exposed to radiation. $I/I_O$ in FIG. 1 is the ratio of intensities beneath the center of the phase-shifting element.

FIG. 2 shows a prior art phase-shifting reticle having a phase-shifting rim. The reticle comprises a reticle base including a quartz plate 10, a phase-shifting rim 12, and a chrome element 11. The phase-shifting rim 12 and chrome element 11 are in contact with the quartz plate 10. The reticle has a reticle opening 13, which is an area of the reticle where the quartz plate 10 does not have the phase-shifting rim 12 and the chrome element 11. The reticle is configured so that the reticle opening 13 is surrounded by the phase-shifting rim 12 that is surrounded by the chrome element 11. The phase-shifting rim 12 has a width of about 0.4 IRF·$\lambda$/NA and a thickness such that radiation transmitted through the phase-shifting rim 12 is shifted about 180° out of phase relative to the radiation transmitted through the reticle opening 13. The transmittance of radiation transmitted through the reticle opening 13 is about the same as the transmittance of radiation transmitted through the phase-shifting rim 12.

Figure 3A:
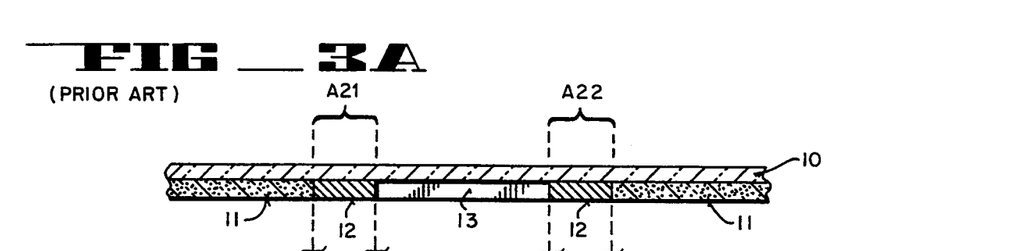
FIG. 3A includes an illustration of a cross-sectional view of the reticle of FIG. 2. (Prior art)
Figure 3B:
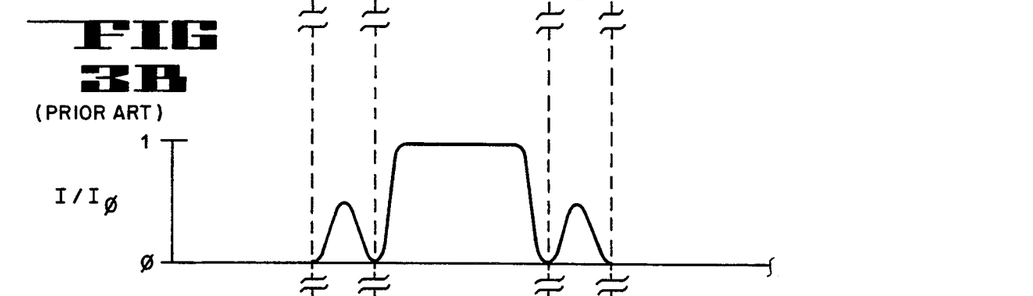
FIG. 3B includes an illustration of $I/I_O$ using the reticle of FIG. 2. (Prior art)
Figure 3C:
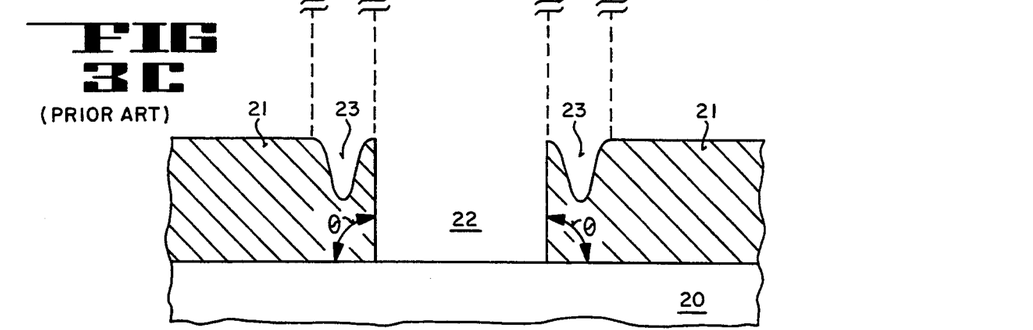
FIG. 3C includes an illustration of a cross-sectional view of a positive photoresist layer patterned using the reticle of FIG. 2. (Prior art)

The reticle is used to pattern a photoresist layer as illustrated in FIGS. 3A, 3B, and 3C. FIG. 3A includes a cross-sectional view of the reticle in FIG. 2 and has the quartz plate 10, the chrome element 11, the phase-shifting rim 12, and the reticle opening 13. When radiation is incident on the reticle, the radiation is transmitted through the reticle opening 13 and the phase-shifting rim 12, but the chrome element 11 prevents virtually all transmission of radiation. FIG. 3B illustrates how $I/I_O$ may vary across the photoresist layer surface when using the reticle illustrated in FIG. 2. As seen with FIG. 3B, $I/I_O$ under the chrome element 11 is substantially zero, and $I/I_O$ under reticle opening 13 away from the phase-shifting rim 12 is close to unity.

Interference areas A21 and A22 each include a portion of the phase-shifting rim 12 as shown in FIG. 3A. Within each interference area, the radiation transmitted through the phase-shifting rim 12 is shifted about 180° out of phase relative to the radiation transmitted through the reticle opening 13. Radiation from the reticle opening 13 that enters the interference areas is interfered with by the radiation that is transmitted through the phase-shifting rim 12 within the interference areas. In theory, the interference should prevent radiation from reaching the photoresist layer under the interference areas. After developing, a theoretical patterned photoresist layer has photoresist elements having a wall angle ($\theta$) of 90° without a recession and a photoresist layer opening having no residual photoresist layer. As used in this application, the wall angle is an angle formed by the edge of a photoresist element at a photoresist layer opening with respect to the substrate surface under the photoresist element. The wall angle is measured from the substrate surface, and a wall angle of 90° is a vertical edge.

The actual patterned photoresist layer typically has at least one problem. As seen in FIG. 1, some radiation reaches the photoresist layer under a phase-shifting element regardless of the phase-shifting element width. FIG. 1 illustrates that $I/I_O$ beneath the center of the phase-shifting element increases as the width of the phase-shifting element increases. $I/I_O$ under the center of the phase-shifting element is about 0.15 when the phase-shifting element width is about 0.4 IRF·$\lambda$/NA. After developing, the photoresist layer has resist elements 21 each with a recession 23 near a photoresist layer opening 22 as shown in FIG. 3C. The recessions have a depth greater than 10% of the resist element thickness away from the recession. When the phase-shifting rim 12 is relatively narrow (about 0.1 IRF·$\lambda$/NA), the photoresist elements may have wall angles ($\theta$) less than 80° or greater than 100° and are similar to photoresist elements formed using a conventional reticle to pattern a photoresist layer having a dimension smaller than the conventional resolution limit. A recession with a depth greater than 10% of the resist element thickness away from the recession or a wall angle less than 80° or greater than 100° may cause processing complications during subsequent processing steps including etching and ion implantation.

At an intermediate phase-shifting element width (between 0.1 and 0.4 IRF·$\lambda$/NA), the resolution may be too low and the recession may be too deep. In determining the width of a phase-shifting element, one typically chooses the widest phase-shifting element width without giving a recession too deep within the photoresist element. Typically, the prior art phase-shifting element width is about 0.15 IRF·$\lambda$/NA. At 0.15 IRF·$\lambda$/NA, $k_1$ is closer to a conventional reticle's $k_1$ than $k_1$ for a phase-shifting element width of 0.4 IRF·$\lambda$/NA. Therefore, the prior art phase-shifting reticle only gives a marginal improvement in resolution.

Even if the reticle pattern may be resolved within the photoresist layer when the phase-shifting element width is about 0.15 IRF·$\lambda$/NA, the process window for forming the photoresist pattern is smaller than when the phase-shifting element is closer to 0.40 IRF·$\lambda$/NA. Again, there is a tradeoff. The tradeoff is between production repeatability and the depth of the recession.

The prior art phase-shifting reticle is difficult to generate. State of the art reticle generating equipment currently has a resolution limit slightly below 1 $\mu$m. A prior art phase-shifting element typically has a width of about 0.15 IRF·$\lambda$/NA, which is about 0.51 $\mu$m wide when IRF is about 5, $\lambda$ is about 365 nm, and NA is about 0.54. Therefore, a reticle having a phase-shifting element with a width of about 0.51 $\mu$m is difficult to generate.

The previous discussion focuses on a positive photoresist layer. A negative photoresist layer has a reversed image compared to the positive photoresist layer. After developing, a negative photoresist layer formed using the prior art phase-shifting reticle has a negative photoresist element under the reticle opening and negative photoresist layer openings under phase-shifting rim and the chrome element. The negative photoresist element has a wall angle less than 80° or greater than 100°, or each negative photoresist layer opening has a residual negative photoresist layer with a thickness greater than 5% of the negative photoresist element thickness. The negative and positive photoresist layers formed using the conventional reticle or the prior an phase-shifting reticle may cause complications during subsequent processing steps.

SUMMARY AND OBJECTS OF THE INVENTION

In view of the foregoing, one object of the present invention is to form a patterned resist layer having a dimension smaller than the conventional resolution limit and a resist element with a wall angle of about 90°.

Another object of the present invention is to pattern a positive resist layer to form a resist element having a dimension smaller than the conventional resolution limit and a recession with a depth no greater than 10% of the resist dement thickness away from the recession.

It is yet another object of the present invention to pattern a negative resist layer to form a resist layer opening having a dimension smaller than the conventional resolution limit and a resist layer opening having a residual resist layer, if any, with a thickness no greater than 5% of the resist element thickness.

It is still another object of the present invention to form a patterned resist layer having a dimension smaller than the conventional resolution limit and an increased process window for forming the patterned resist layer compared to the prior art.

It is a further object of the present invention to generate a phase-shifting reticle in a manufacturable manner that has a phase-shifting element that can be readily resolved during the reticle's generation.

A reticle and a method of forming a patterned resist layer on a semiconductor substrate using the reticle are described. In the currently preferred embodiment, the reticle has an opaque element, a phase-shifting element with a phase-shifting transmittance, and a reticle opening with a reticle opening transmittance. The phase-shifting element has a thickness such that a radiation wave having a wavelength that is transmitted through the phase-shifting element is about 180° out of phase relative to radiation that is transmitted through the reticle opening. Unlike the prior art, the phase-shifting element transmittance is less than the reticle opening transmittance. The phase-shifting transmittance is such that $I/I_O$ beneath the phase-shifting element is no greater than 0.10.

The reticle is used to form a patterned resist layer on a semiconductor substrate. A resist layer is coated on the substrate. The resist layer is selectively exposed using the reticle. The resist layer is developed to form the patterned resist layer including at least one resist layer opening and at least one resist element. The patterned resist layer includes at least one dimension smaller than the conventional resolution limit. When a positive resist material is used, the resist element has a wall angle between about 80° and about 100° and a recession with a depth no greater than 10% of the resist element thickness away from the recession. When a negative resist material is used, the resist element has a wall angle between about 80° and about 100°, and the resist layer opening has a residual resist layer, if any, having a thickness no greater than 5% of the resist element thickness. The present invention is not limited by the embodiments described herein.

The phase-shifting transmittance of the present invention reduces $I/I_O$ beneath the phase-shifting element when compared to a prior an phase-shifting reticle having a phase-shifting element of about the same width. Therefore, the present invention reticle may have a wider phase-shifting dement and still have about the same or lower $I/I_O$ beneath the phase-shifting element compared to a prior an reticle having a narrower phase-shifting element. The resolution of the present invention reticle is typically better than the resolution of a prior an phase-shifting reticle.

The present invention reticle typically has a larger process window compared to a convention reticle or a prior art reticle. The larger process window allows greater processing latitude that makes a small dimensional pattern easier to form. The present invention reticle is typically easier to generate than the prior an phase-shifting reticle because the present invention reticle has a phase-shifting element that is wider. A phase-shifting element of the present invention reticle may have a width of about 0.74 μm, whereas a prior an phase-shifting element may have a width about 0.5 μm.

Other objects, features, and advantages of the present invention will be apparent from the accompanying drawings and from the derailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Embodiments of the present invention include a reticle having a reticle opening with a reticle opening transmittance, a phase-shifting element with a phase-shifting transmittance, and an opaque element. Unlike the prior art, the phase-shifting transmittance is less than the reticle opening transmittance. The phase-shifting transmittance is such that $I/I_O$ at the photoresist surface and beneath the phase-shifting element is no greater than 0.10. The reticle is used to form a patterned resist layer on a semiconductor substrate. A resist layer is coated on the substrate and is selectively exposed using the reticle. The resist layer is developed to form the patterned resist layer including at least one resist layer opening and at least one resist element. The patterned resist layer includes at least one dimension smaller than the conventional resolution limit. When a positive resist material is used, the resist element has a wall angle between about 80° and about 100° and a recession with a depth no greater than 10% of the resist dement thickness away from the recession. When a negative resist material is used, the resist element has a wall angle between about 80° and about 100°, and the resist layer opening has a residual resist layer, if any, having a thickness no greater than 5% of the resist dement thickness. The present invention is not limited by the embodiments described herein.

A variety of patterned resist layers may be formed. The present invention may be used to pattern a resist layer having dimensions larger or smaller than the conventional resolution limit. The patterned resist layer may be used as a masking layer during a dielectric, silicon, or metal etch step or as a masking layer during a doping step. A large number of patterns can be formed using the present invention. A patterned resist layer may be used for defining contact openings, polysilicon word lines, metal lines, field isolation regions, ion implanted regions, etc. Patterns that can be formed by the present invention are not limited to the examples given. The present invention may be used with any semiconductor technology including bipolar, metal-oxide-semiconductor, and III-V semiconductors, A variety of materials and equipment can be used. The reticle may be made of many different materials. A reticle base may comprise quartz, glass, silicon, silicon nitride, silicon oxynitride, or boron nitride. Chrome, gold, copper, and other metallic compounds may be used for an opaque element. A polysilicon stencil or "see through" reticle may be used, although the reticle may be more difficult to manufacture. Any material that is opaque to the radiation may be used as an opaque element. A phase-shifting element may be made of a material including photoresist, silicon dioxide, polyimide, silicon nitride, silicon oxynitride, and poly (methyl methacrylate), which is hereinafter called PMMA.

If the transmittance of the phase-shifting material is too great, the transmittance may be reduced using a transmittance reducing compound (e.g. dye, for example), or making the phase-shifting element thicker. For a phase-shifting material that is coated onto a reticle, a dye should be added before coating if the transmittance is too great. The thickness difference between the reticle opening and the phase-shifting element may be changed to increase the difference between the reticle opening transmittance and the phase-shifting transmittance. The thickness difference may be accomplished by increasing the thickness of the phase-shifting element or by etching more of a quartz or glass plate within a reticle opening. The index of refraction of the phase-shifting material must be known so that its thickness can be determined. The equation for the phase-shifting element thickness appears later in the specification.

Resist materials including positive photoresist, negative photoresist, contrast enhanced photoresist, and resist materials that are patterned using radiation having a wavelength outside of the visible fight spectrum may be used with the present invention. Other materials, such as an anti-reflective coating, for example, may be used with a resist layer.

The present invention may be used with a lithographic printer regardless of radiation wavelength and numerical aperture. Examples of lithographic printers include projection printers and proximity printers. Commercially available lithographic printers typically operate at a wavelength ($\lambda$) no longer than about 436 nm and have a lens with a numerical aperture (NA) between about 0.17 and about 0.54 and an image reduction factor between about $1 \times 1$ and about $10 \times 1$.

Within this application, a phase-shifting element is typically a phase-shifting rim or a phase-shifting outrigger. A phase-shifting rim is a phase-shifting element having an opaque element on one side of the phase-shifting element and a reticle opening on a different side of the phase-shifting element (see FIG. 5). A phase-shifting outrigger is a phase-shifting element surrounded on all sides by an opaque element (see FIG. 8) or a phase-shifting element surrounded on all sides by a reticle opening.

Figure 4:
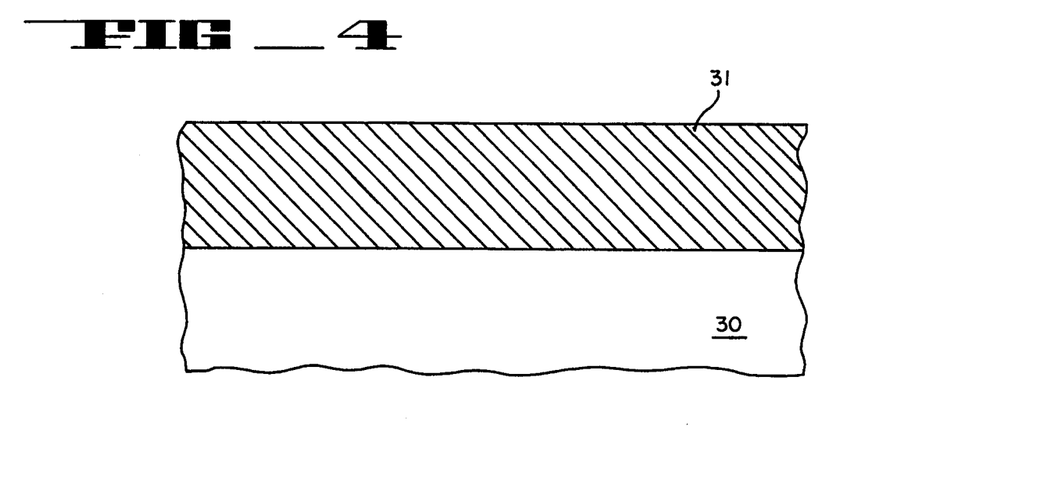
FIG. 4 includes an illustration of a cross-sectional view of a substrate coated with a positive photoresist layer.

In the currently preferred embodiment of the present invention, a semiconductor substrate 30 is coated with a positive photoresist layer 31 about 1 $\mu$m thick as shown in FIG. 4. The substrate 30 is placed in a lithographic printer. In the currently preferred embodiment, the lithographic printer is a projection printer having a radiation source that emits a radiation wave at a wavelength of about 365 nm, a lens with a numerical aperture of about 0.54 and an image reduction factor of about $5 \times 1$. The $5 \times 1$ image reduction factor means that an image on the reticle is reduced by about five times when the image reaches the surface of the photoresist layer. The lens is disposed between the radiation source and the photoresist layer. An example of the projection printer is a Nikon i-line projection printer. A reticle is put into the projection printer, and the reticle is disposed between the radiation source and the lens. In an alternate embodiment, the radiation source may be external to the projection printer.

Figure 5:
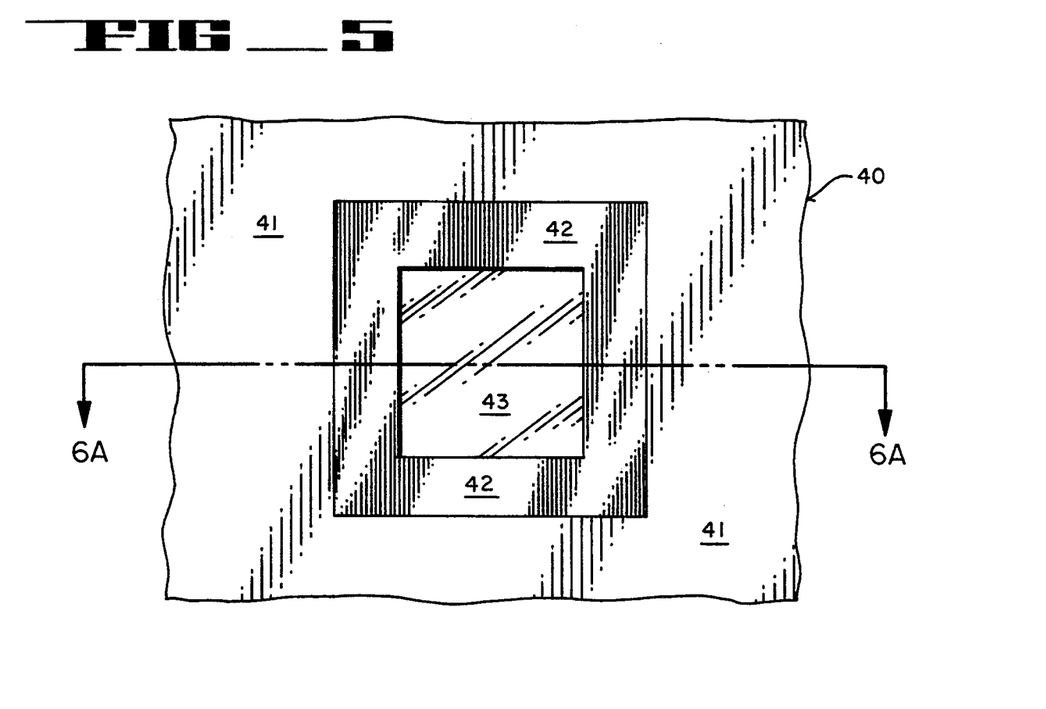
FIG. 5 includes an illustration of a top view of a reticle having a phase-shifting rim in accordance with the currently preferred embodiment of the present invention.

FIG. 5 includes an illustration of the reticle having a quartz plate 40, a chrome element 41, a phase-shifting rim 42, and a reticle opening 43. The phase-shifting rim 42 and the chrome element 41 are in contact with the quartz plate 40. The reticle opening 43 is an area of the reticle where the quartz plate 40 does not have the phase-shifting rim 42 and the chrome element 41. The reticle opening 43 is substantially square and about 2.5 $\mu$m long on each side. The reticle opening 43 is surrounded by the phase-shifting rim 42. The phase-shifting rim 42 comprises silicon nitride and is about 0.74 $\mu$m wide and about 183 nm thick. The phase-shifting rim 42 is surrounded by a chrome element 41.

Figures 6A, 6B:
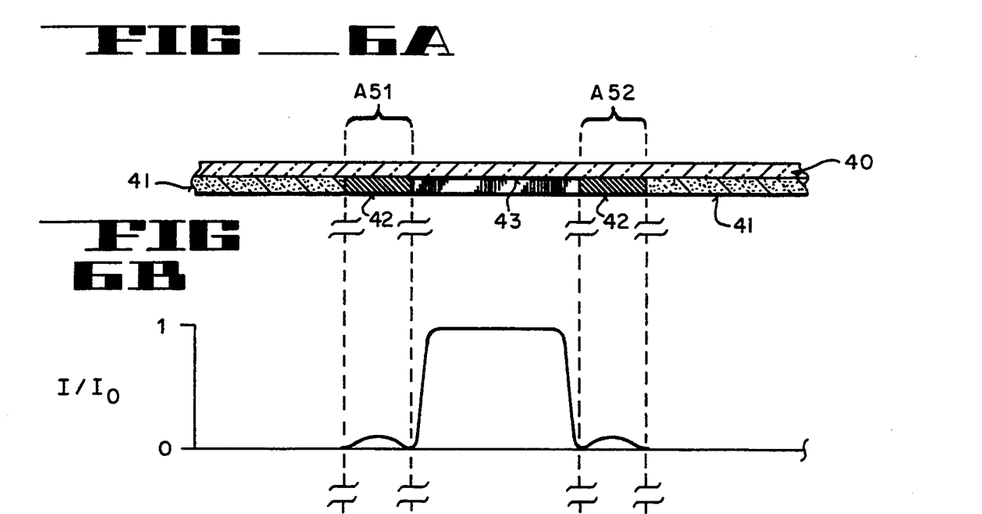
FIG. 6A includes an illustration of a cross-sectional view of the reticle in FIG. 5 in accordance with the currently preferred embodiment of the present invention.
FIG. 6B includes an illustration of $I/I_O$ using the reticle of FIG. 5 to expose the photoresist layer of FIG. 4.

The photoresist layer is selectively exposed to radiation having a wavelength of about 365 nm. When exposed, the reticle has three types of areas as shown in FIG. 6A. A first area includes the reticle opening 43 having a reticle opening transmittance. Second areas include the phase-shifting rim 42 and lie on opposite sides and adjacent to the first area. Unlike the prior art, the phase-shifting rim 42 has a phase-shifting transmittance that is less than the reticle opening transmittance. In the currently preferred embodiment, the phase-shifting transmittance is about 0.20 times the reticle opening an transmittance. A dye may be included within the phase-shifting element to achieve the phase-shifting transmittance. Unlike the present invention, the prior art phase-shifting transmittance is about the same as the reticle opening transmittance. In the currently preferred embodiment, the second area shifts radiation transmitted through it is approximately 180° out of phase relative to radiation transmitted through the first area. Third areas include the chrome element 41. Each third area lies adjacent to a second area on the second area's side opposite that of the first area. The third areas are substantially opaque to prevent virtually all transmission of radiation.

FIG. 6B illustrates how $I/I_O$ may vary across the photoresist layer surface when using the reticle illustrated in FIG. 5. $I/I_O$ under the first area away from the second area is about unity, and $I/I_O$ under the third areas is about zero. The second areas are within interference areas A51 and A52. Some radiation from the first area enters the interference areas. The radiation exiting the phase-shifting rim 42 interferes with the radiation exiting the reticle opening 43 that enters the interference areas A51 and A52. $I/I_O$ beneath the second areas is no greater than 0.10 because the phase-shifting transmittance is less than the reticle opening transmittance and because of interference within the interference areas.

Figure 6C:
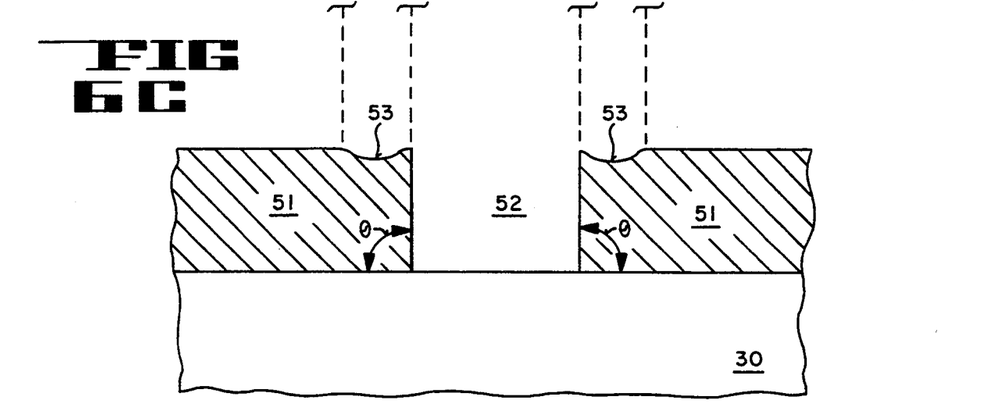
FIG. 6C includes an illustration of a cross-sectional view of the photoresist layer patterned using the reticle of FIG. 5 in accordance with the currently preferred embodiment of the present invention.

The substrate is removed from the projection printer and developed to form the photoresist layer illustrated in FIG. 6C. The photoresist layer includes a photoresist layer opening 52 and photoresist elements 51. The photoresist layer opening 52 lies beneath the first area of the reticle. The photoresist layer opening 52 is about 0.50 $\mu$m wide because of the $5 \times 1$ image reduction factor. The photoresist elements 51 lie beneath the second and third areas of the reticle. The resist elements 51 each have a wall angle ($\theta$) between about 80° and about 100° because the photoresist layer opening width is wider than the resolution limit for the given phase-shifting rim width, $\lambda$, and NA. The resist elements 51 each have a recession 53 with a depth no greater than 10% of the resist element thickness away from the recession because the phase-shifting transmittance of the currently preferred embodiment reduces $I/I_O$ beneath the second areas. The dimensions in FIG. 6A are about five times larger than FIGS. 6B and 6C because of the image reduction factor. The figures are drawn to different scales to better illustrate the currently preferred embodiment of the present invention.

The photoresist layer opening formed by the currently preferred embodiment (about 0.50 $\mu$m wide) is narrower than the conventional resolution limit (about 0.54 $\mu$m) for the wavelength and the numerical aperture previously given. Therefore, a patterned resist layer having a dimension smaller than the conventional resolution limit is formed. The patterned resist layer comprising a positive resist material includes the resist element having the wall angle between about 80° and about 100° and the recession with a depth no greater than 10% of the resist element thickness away from the recession. A patterned resist layer comprising a negative resist material includes a resist element having a wall angle between about 80° and about 100° and a resist layer opening having a residual resist layer, if any, with a thickness no greater than 5% of the resist element thickness. Preferably, no residual resist layer is formed within the resist layer opening. If a residual resist layer is formed within the resist layer opening, a short plasma ashing step may be performed to remove the residual resist layer. The prior an reticle having a phase-shifting transmittance about the same as the reticle opening transmittance forms a patterned resist layer having a resist element having a wall angle less than 80° or greater than 100°, a resist element having a recession with a depth greater than 10% of the resist element thickness away from the recession, or a resist layer opening having a residual resist layer with a thickness greater than 5% of the resist element thickness.

Many variations may be used without deviating from the spirit or scope of the present invention. The reticle may have a combination of phase-shifting elements. In an alternate embodiment, the phase-shifting rim is a first phase-shifting dement, and a second phase-shifting element lies inside the phase-shifting rim. Referring to FIG. 5, the second phase-shifting element replaces the reticle opening 43. The first and the second phase-shifting elements have a first and a second phase-shifting transmittance, respectively. The first phase-shifting transmittance is less than the second phase-shifting transmittance. The thicknesses of the first and second phase-shifting elements are adjusted so that the radiation wave phase difference between radiation transmitted through the first phase-shifting element is about 180° out of phase relative to radiation transmitted through the second phase-shifting element.

The exact value of the phase-shifting transmittance is not known, but it is believed that the phase-shifting transmittance should decrease as the phase-shifting element width increases, so that $I/I_o$ beneath a second area does not exceed 0.10. In general, the phase-shifting transmittance should be about equivalent to the following equation:

$$\tau_1 = \tau_2 \cdot [(0.10 IRF \cdot \lambda / NA)/w]^2$$

where $\tau_1$ is the phase-shifting transmittance of the currently preferred embodiment or the first phase-shifting transmittance of the previously described alternate embodiment, $\tau_2$ is the reticle opening transmittance of the currently preferred embodiment or the second phase-shifting transmittance of the previously described alternate embodiment, IRF is the image reduction factor, $\lambda$ is the wavelength of the radiation, NA is the numerical aperture, and w is the width of the phase-shifting element expressed in units of $IRF \cdot \lambda / NA$. A phase-shifting element may have a width between about 0.1 $IRF \cdot \lambda /NA$ to about 0.4 $IRF \cdot \lambda /NA$ when using the present invention. The phase-shifting rim of the currently preferred embodiment is about 0.74 $\mu$m wide, which is about 0.22 $IRF \cdot \lambda /NA$ for the previously described IRF, $\lambda$, and NA. Therefore, the phase-shifting transmittance ($\tau_1$) should be about 0.20 times the reticle opening transmittance ($\tau_2$). Many resist materials may be significantly exposed by a reticle having a large phase-shifting element (several square microns in area) when the phase-shifting transmittance is as low as 10-20%. Because the phase-shifting transmittance is adjusted depending on the width of the phase-shifting width, $\tau_1$ may be between 0.20 and 0.75 times $\tau_2$. The embodiments of the present invention do not significantly expose the photoresist layer under the phase-shifting elements. A phase-shifting element is generally at least 0.15 $IRF \cdot \lambda /NA$ wide and typically has $\tau_1$ no greater than 0.50 times $\tau_2$.

An alternate embodiment has a phase-shifting transmittance that varies with the distance from a reticle opening. Referring to FIG. 5, the phase-shifting rim 42 may have a phase-shifting transmittance near the reticle opening 43 that is about the same as the reticle opening transmittance. As the distance from the reticle opening increases, the phase-shifting transmittance decreases. The phase-shifting transmittance is at its lowest value where the phase-shifting rim 42 touches the chrome element 41.

Ways of reducing the phase-shifting transmittance include 1) selecting a phase-shifting material with a lower transmittance, 2) having at least one dye within or coated onto the phase-shifting element, or 3) increasing the thickness of the phase-shifting element. The general equation for the thickness of the phase-shifting element regardless of the transmittance is about:

$$\frac{x \cdot \lambda}{2(\eta - 1)}$$

where x is an odd-numbered integer (1, 3, 5, etc.), $\lambda$ is the wavelength of the radiation, and $\eta$ is the phase-shifting material's index of refraction. The lowest value for x, while still giving the desired transmittance, should be used. In the currently preferred embodiment described above, x is one. If the reticle opening and phase-shifting element are comprised of the same material, x may be a large number so that the phase-shifting transmittance is sufficiently reduced.

Figure 7:
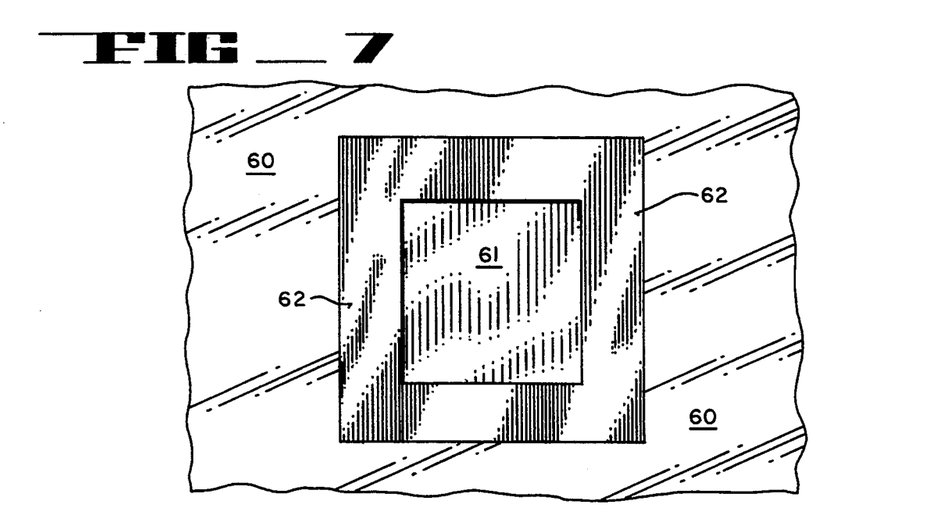
FIGS. 7–13 include illustrations of top views of reticles having alternative embodiments of the present invention.
Figure 8:
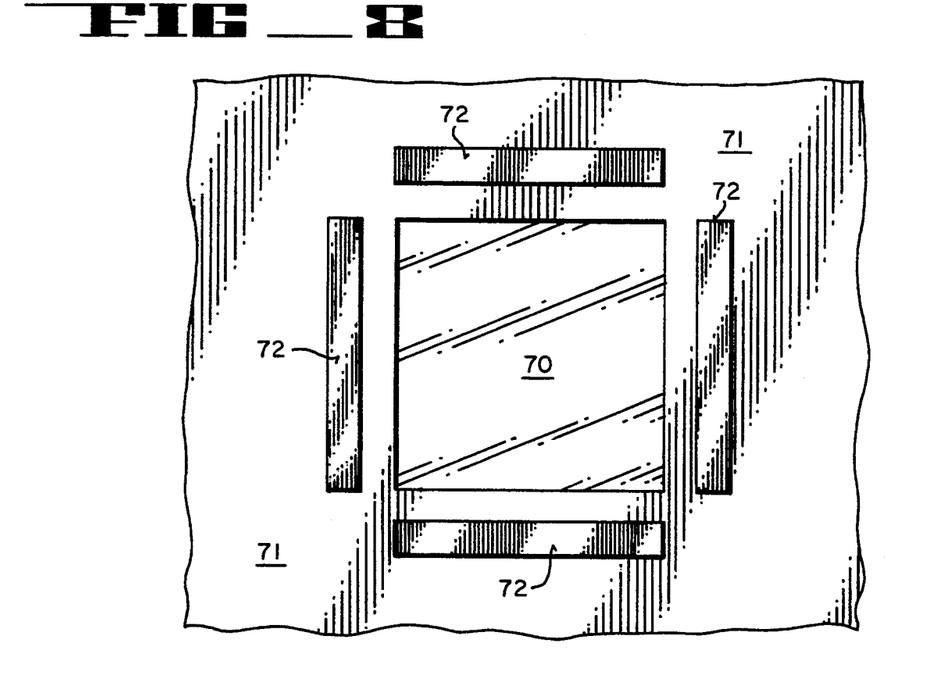
Figure 9:
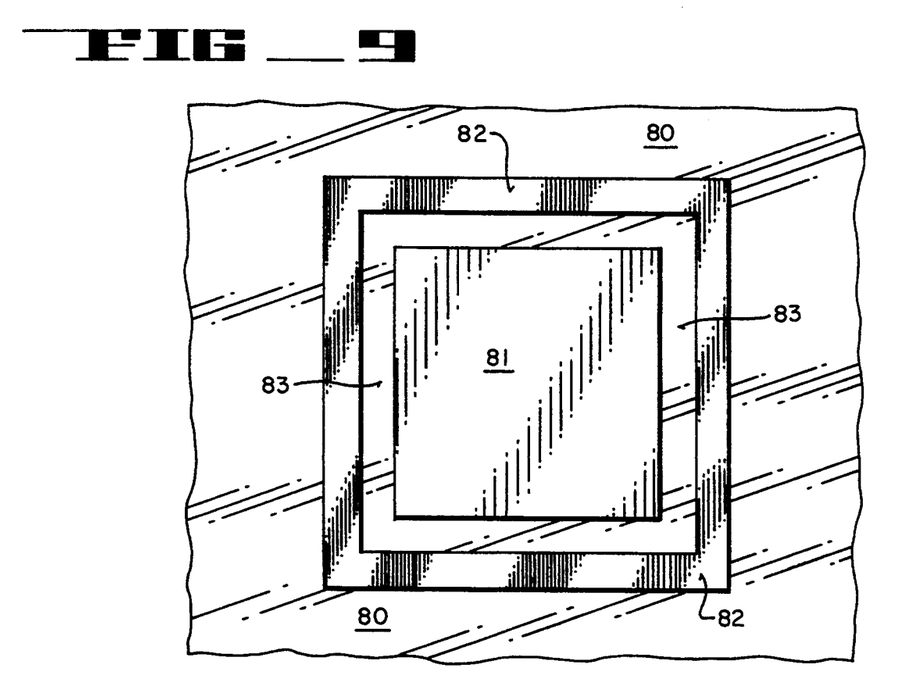
Figure 10:
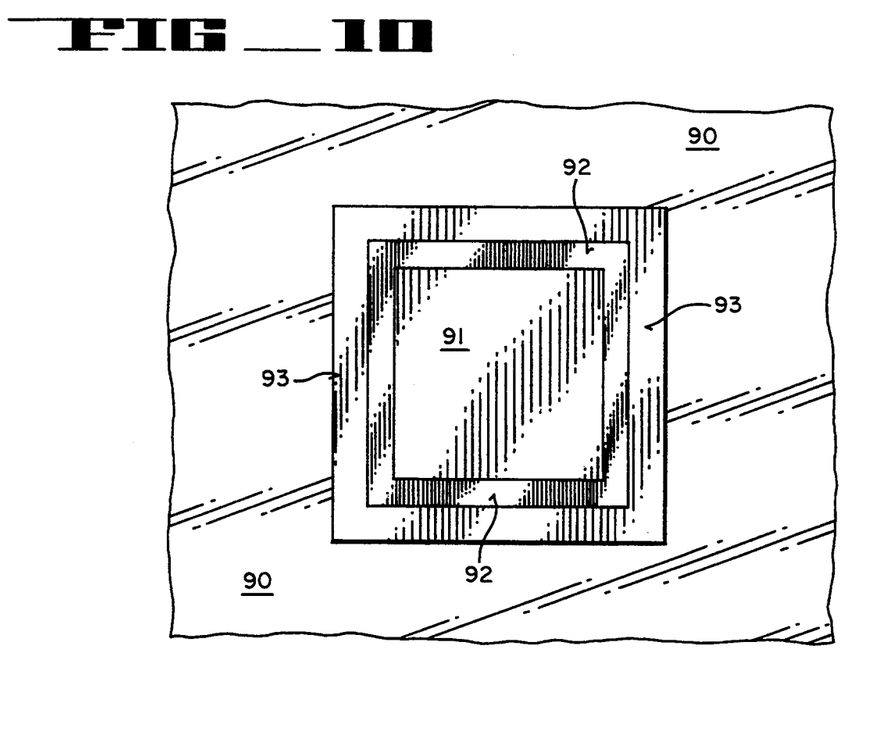

Alternate embodiments of the present invention are shown in FIGS. 7-13. In FIG. 7, a chrome element 61 is surrounded by a phase-shifting rim 62 that is surrounded by a reticle opening 60. FIG. 8 includes an embodiment using phase-shifting outriggers. FIG. 8 includes a reticle opening 70 having a reticle opening transmittance that is surrounded by a chrome element 71. The reticle includes four outriggers 72, which are each rectangular phase-shifting elements having a phase-shifting transmittance that is less than the reticle opening transmittance. The outriggers 72 lie near the edges of the reticle opening 70. The spacing of the outriggers 72 are such that the distance between the center of the reticle opening 70 and the center of an outrigger 72 is about 0.7 $IRF \cdot \lambda /NA$ to about 0.8 $IRF \cdot \lambda /NA$. FIG. 9 has a chrome element 81 surrounded by a first reticle opening 83 that is surrounded by a phase-shifting rim 82. The phase-shifting rim 82 is surrounded by a second reticle opening 80. FIG. 10 includes a chrome element 91 that is surrounded by a phase-shifting rim 92 that is surrounded by a chrome rim 93. The chrome rim 93 is surrounded by a reticle opening 90. FIGS. 7-10 are presented for illustrative purposes and may have dimensions that may vary from FIG. 5.

Figure 11:
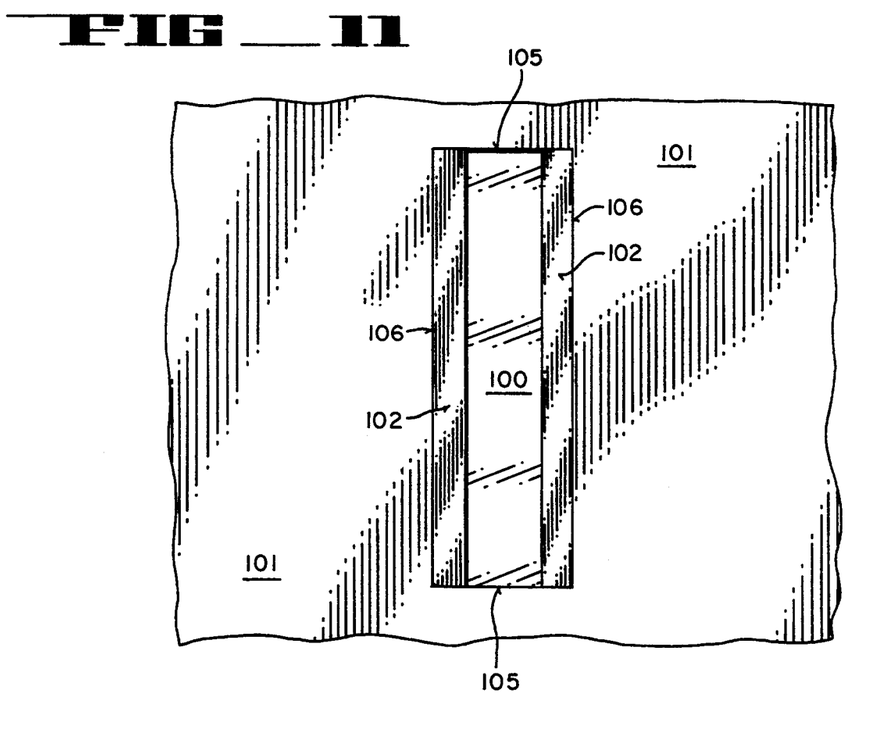

An alternate embodiment of the present invention may be used to form a resist layer pattern other than a square pattern or a resist layer pattern having a dimension larger than the conventional resolution limit. FIG. 11 includes an illustration of a reticle used to form a rectangular pattern in a positive photoresist layer, wherein a dimension (width) is smaller than the conventional resolution limit and another dimension (length) is larger than the conventional resolution limit. The reticle includes a reticle opening 100 that is about 15 $\mu$m long and about 2.5 μm wide. Phase-shifting elements 102 lie along the long sides of the reticle opening. Each phase-shifting element 102 is about 15 μm long and about 1.0 μm wide. The transmittance of the phase-shifting elements 102 is less than the transmittance of the reticle opening 100. A chrome element 101 surrounds the reticle opening 100 and the phase-shifting elements 102. The chrome element 101 has long sides 106 that are each about 15 μm and short sides 105 that are each about 4.5 μm. The phase-shifting elements 102 lie along the entire length of the long sides 106, but not along the entire length of the short sides 105.

The reticle is placed in the previously described projection printer including the radiation source and lens. After a positive photoresist layer is coated on a substrate, selectively exposed with the reticle, and developed, a photoresist layer opening surrounded by a photoresist element is formed within the photoresist layer. The photoresist layer opening is about 3.0 μm long and about 0.5 μm wide. Therefore, the photoresist layer pattern formed has a photoresist layer opening with a dimension (width) that is smaller than the conventional resolution limit (about 0.54 μm and another dimension (length) that is larger than the conventional resolution limit. Phase-shifting elements are not needed along the entire length of short sides 105 because the length of the photoresist layer opening is longer than the conventional resolution limit. The phase-shifting elements are needed along the long sides 106 because the width of the photoresist layer opening is less than the conventional resolution limit. Phase-shifting elements may be used along all of sides of the chrome opening, but the dimensions of the photoresist layer opening may be changed. The patterned photoresist layer includes a resist element and a resist layer opening. The resist element has a wall angle between about 80° and about 100° because the phase-shifting element width reduces $k_1$, so that the resist layer opening width is wider than the resolution limit. The resist element has a recession with a depth no greater than 10% of the resist element thickness away from the recession because the phase-shifting transmittance is less than the reticle opening transmittance and because of interference within the interference areas. A variety of patterns having dimensions that are larger or smaller than the conventional resolution limit may be formed.

Figure 12:
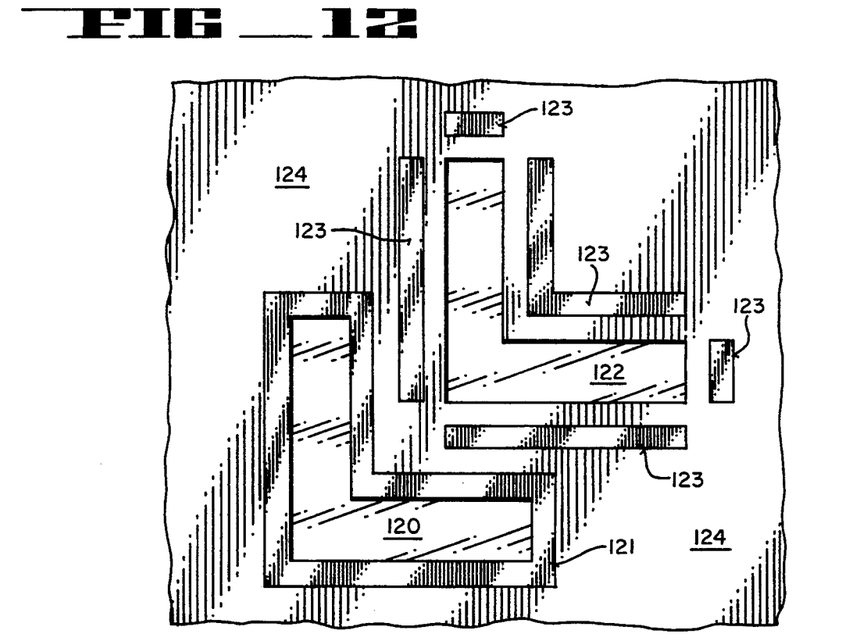
Figure 13:
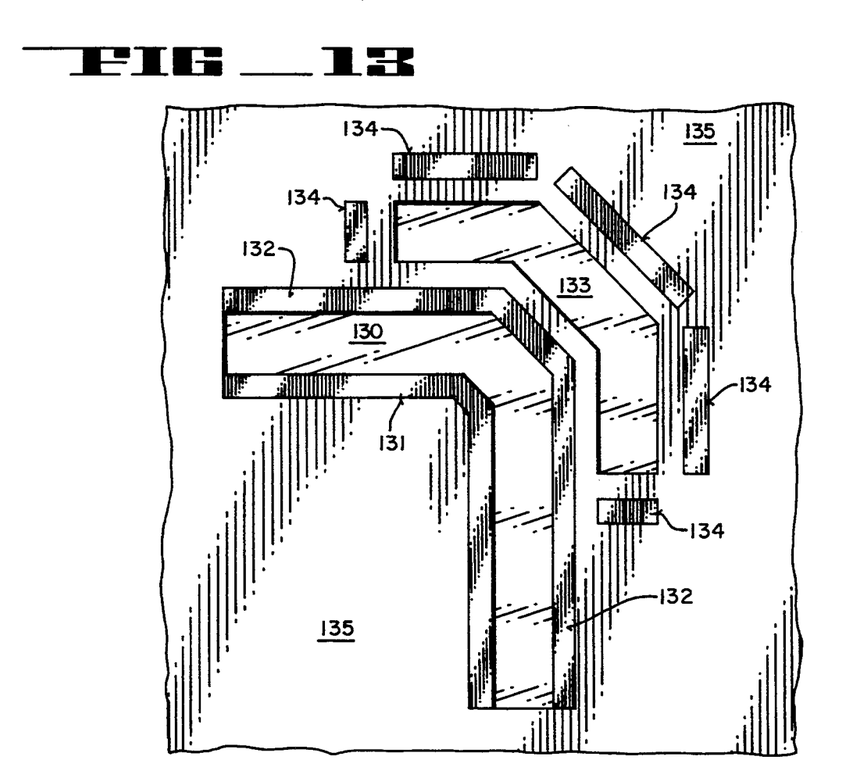

FIG. 12 includes an illustration of an "L-bar" pattern using both a phase-shifting rim and phase-shifting outriggers. Reticle opening 120 is surrounding by a phase-shifting rim 121. Reticle opening 122 is surrounded by phase-shifting outriggers 123. FIG. 12 also includes a chrome element 124. Patterns other than rectilinear patterns may be formed with the present invention as shown in FIG. 13. Reticle opening 130 has a phase-shifting element 131 on one side and a phase-shifting element 132 on the opposite side. Reticle opening 133 is partially surrounded by phase-shifting outriggers 134. Part of phase-shifting element 132 acts as a phase-shifting outrigger for reticle opening 133. Therefore, part of phase-shifting element 132 simultaneously acts as a rim with respect to reticle opening 130 and as an outrigger with respect to reticle opening 133.

The present invention includes benefits described below. The currently preferred embodiment includes a reticle having a reticle opening with a reticle opening transmittance and a phase-shifting element with a phase-shifting transmittance, wherein the phase-shifting transmittance is less than the reticle opening transmittance.

The phase-shifting transmittance is such that $I/I_O$ is no greater than 0.10. A positive resist layer patterned with the reticle of the present invention forms a resist element having a recession with a depth no greater than 10% of the resist element thickness away from the recession. A negative resist layer patterned with the reticle of the present invention forms a resist layer opening having a residual resist layer, if any, with a thickness no greater than 5% of the resist element thickness. The present invention reticle may have a wider phase-shifting element and still have about the same or lower intensity radiation at the photoresist layer compared to a prior art reticle having a narrower phase-shifting element with a phase-shifting transmittance about the same as a reticle opening transmittance.

As the width of the phase-shifting element gets closer to 0.4 IRF·λ/NA, the process constant, $k_1$, gets closer to 0.7. The resolution limit decreases and smaller dimensional patterns may be resolved because wider phase-shifting elements may be used with the present invention reticle. When a patterned resist layer has dimensions that are larger the resolution limit, a resist element within the patterned resist layer typically has a wall angle between 80° and about 100°. The present invention reticle is more likely to form a resist element with a wall angle between about 80° and about 100° because the present invention reticle typically has a smaller resolution limit compared to the prior an phase-shifting reticle having a narrower phase-shifting element.

The processing window for forming a patterned resist layer with the present invention reticle is larger compared to a prior an phase-shifting reticle because of the improvement in resolution. For example, an embodiment using the present invention reticle may have a resolution limit of about 0.47 μm, and a method using the prior art phase-shifting reticle may have a resolution limit of about 0.53 μm. If a resist layer is to be patterned with a resist layer element or a resist layer opening of about 0.55 μm wide, the embodiment using the present invention reticle more easily patterns the resist layer than the method using the prior an phase-shifting reticle because the resolution limit of the present invention reticle is further from the desired dimension.

The present invention reticle is typically easier to generate than a prior art phase-shifting reticle. State of the an reticle generating equipment currently has a resolution limit slightly below 1μm. The currently preferred embodiment previously described has a phase-shifting rim that is about 0.22 IRF·λ/NA or about 0.74 μm wide when IRF is about 5, λ is about 365 nm, and NA is about 0.54. A prior an phase-shifting reticle typically has a phase-shifting rim that is about 0.15 IRF·λ/NA or about 0.5 μm wide when IRF is about 5, λ is about 365 nm, and NA is about 0.54. The present invention reticle is easier to generate compared to the prior an reticle because the present invention phase-shifting element has a width closer to the resolution limit of the reticle generating equipment.

In the foregoing specification, the invention has been described with reference to specific embodiments thereof. It will, however, be evident that various modifications and changes made thereto without departing from the broader spirit and scope of the invention as set forth in the appended claims. The specification and drawings are, accordingly, to be regarded in an illustrative rather than a restrictive sense.

What is claimed is:

1. A method of forming a patterned resist layer on a semiconductor substrate comprising the steps of:
   coating the substrate with a resist layer,
   selectively exposing the resist layer to a radiation wave having a wavelength that is transmitted through a reticle, the reticle including:
      at least one fast area having a first transmittance;
      at least one second area adjacent to the fast area, the second area having a second transmittance that is less than the fast transmittance, the second area shifting radiation transmitted through the second area approximately 180° out of phase relative to radiation transmitted through the first area;
      at least one third area adjacent to the second area, the third area being substantially opaque to prevent virtually all transmission of radiation; and
   developing the resist layer to form the patterned resist layer including at least one resist layer opening and at least one resist element.

2. The method of claim 1, wherein the patterned resist layer has a feature having at least one dimension smaller than the conventional resolution limit, and wherein the second area has a width such that the resist element has a wall angle between 80° and about 100°.

3. The method of claim 2, wherein the resist layer comprises a positive resist material, and wherein the resist element has a recession with a depth no greater than 10% of the resist element thickness away from the recession.

4. The method of claim 2, wherein the resist layer comprises a negative resist material, and wherein the resist layer opening has a residual resist layer with a thickness no greater than 5% of the resist element thickness.

5. The method of claim 2, wherein the resist layer comprises a negative resist material, and wherein the resist layer opening is formed without a residual resist layer.

6. The method of claim 1, wherein the second area comprises a phase-shifting element having a thickness approximately equivalent to an amount calculated as follows:
   multiplying an odd-numbered integer times the wavelength to form a first product;
   subtracting one from the phase-shifting element's index of refraction to form a difference;
   doubling the difference to form a second product; and
   dividing the first product by the second product.

7. The method of claim 1, wherein the selectively exposing step uses a lithographic printer having an exposure wavelength $\lambda$, and including a lens with a numerical aperture (NA) and an image reduction factor (IRF),
   wherein the second area includes a phase-shifting element having a width (w) between about 0.1 to about 0.4 times IRF*$\lambda$/NA, and
   wherein the second transmittance is about equivalent to the first transmittance multiplied by:

$$((0.10 IRF*\lambda/NA)/w)^2.$$

8. The method of claim 1, wherein the second area comprises a phase-shifting element including a dye.

9. The method of claim 1, wherein the second transmittance is between about 0.20 and about 0.75 times the first transmittance.

10. A method of forming a patterned resist layer, wherein the patterned resist layer is formed on a semiconductor substrate using a projection printer having a lens with a numerical aperture and an image reduction factor, a radiation wave having a wavelength, and a reticle, the method comprising the steps of:
   coating the substrate with a resist layer;
   selectively exposing the resist layer to radiation that is transmitted through the reticle, the reticle including:
      at least one first area having a first transmittance;
      at least one second area adjacent to the first area, the second area having a second transmittance that is no greater than 0.75 times the first transmittance, the second area including a phase-shifting element that shifts radiation transmitted through the second area approximately 180° out of phase relative to radiation transmitted through the first area, the phase-shifting element having a width at least 0.15 times the image reduction factor times the wavelength divided by the numerical aperture;
      at least one third area adjacent to the second area, the third area being substantially opaque to prevent virtually all transmission of radiation; and
   developing the resist layer to form the patterned resist layer including at least one dimension smaller than the conventional resolution limit, at least one resist layer opening, and at least one resist element, the resist element having a wall angle between about 80° and about 100°.

11. The method of claim 10, wherein the resist layer comprises a positive resist material, and wherein the resist element has a recession with a depth no greater than 10% of the resist element thickness away from the recession.

12. The method of claim 10, wherein the resist layer comprises a negative resist material, and wherein the resist layer opening has a residual resist layer with a thickness no greater than 5% of the resist element thickness.

13. The method of claim 10, wherein the resist layer comprises a negative resist material, and wherein the resist layer opening is formed without a residual resist layer.

14. The method of claim 10, wherein the phase-shifting element includes a dye.

15. The method of claim 10, wherein the phase-shifting element thickness is about an amount calculated as follows:
   multiplying an odd-numbered integer times the wavelength to form a first product;
   subtracting one from the phase-shifting element's index of refraction to form a difference;
   doubling the difference to form a second product; and
   dividing the first product by the second product.

16. The method of claim 10, wherein the second transmittance is at least 0.20 times the first transmittance.

17. A reticle for forming a patterned resist layer on a semiconductor substrate by exposing the reticle to a radiation wave having a wavelength, the reticle comprising:
   at least one first area having a first transmittance;
   at least one second area adjacent to the first area, the second area having a second transmittance that is less than the first transmittance, the second area shifting radiation that is transmitted through the second area approximately 180° out of phase relative to radiation that is transmitted through the first area;

at least one third area adjacent to the second area, the third area being substantially opaque to prevent virtually all transmission of radiation.

18. The reticle of claim 17, wherein the second area has a width such that a resist layer patterned using the reticle has a resist element with a wall angle between about 80° and about 100°.

19. The reticle of claim 17, wherein the second area comprises a phase-shifting element including a dye.

20. The reticle of claim 17, wherein the phase-shifting element thickness is about an amount calculated as follows:

multiplying an odd-numbered integer times the wavelength to form a first product;

subtracting one from the phase-shifting element's index of refraction to form a difference;

doubling the difference to form a second product; and dividing the first product by the second product.

21. The reticle of claim 17, wherein the reticle is capable of being used in a lithographic printer having an exposure wavelength $\lambda$, and including a lens with a numerical aperture (NA) and an image reduction factor (IRF), wherein the second area includes a phase-shifting element having a width (w) between about 0.1 to about 0.4 times IRF*$\lambda$/NA, and wherein the second transmittance is about equivalent to the first transmittance multiplied by:

$((0.10 IRF*\lambda/NA)/w)^2$.

22. The reticle of claim 17, wherein the second transmittance is between about 0.20 and 0.75 times the first transmittance.

23. The reticle of claim 17, wherein the first area has a width narrower than the product of the image reduction factor and the conventional resolution limit.

24. The reticle of claim 17, wherein the third area has a width narrower than the product of the image reduction factor and the conventional resolution limit.

25. A reticle for forming a patterned resist layer on a semiconductor substrate, wherein the reticle is used with a projection printer having a lens with a numerical aperture and an image reduction factor and a radiation wave having a wavelength, the reticle comprising:

at least one first area having a fast transmittance;

at least one second area adjacent to the first area, the second area having a second transmittance that is no greater than 0.75 times the first transmittance, the second area including a phase-shifting element that shifts radiation that is transmitted through the second area approximately 180° out of phase relative to radiation that is transmitted through the first area, the phase-shifting element having a width at least about 0.15 times the image reduction factor times the wavelength divided by the numerical aperture;

at least one third area adjacent to the second area, the third area being substantially opaque to prevent virtually all transmission of radiation.

26. The reticle of claim 25, wherein the phase-shifting element includes a dye.

27. The reticle of claim 25, wherein the phase-shifting element thickness is about an amount calculated as follows:

multiplying an odd-numbered integer times the wavelength to form a first product;

subtracting one from the phase-shifting element's index of refraction to form a difference;

doubling the difference to form a second product; and dividing the first product by the second product.

28. The reticle of claim 25, wherein the second transmittance is at least 0.20 times the first transmittance.

29. The reticle of claim 25, wherein the first area has a width narrower than the product of the image reduction factor and the conventional resolution limit.

30. The reticle of claim 25, wherein the third area has a width narrower than the product of the image reduction factor and the conventional resolution limit.

* * * * *

UNITED STATES PATENT AND TRADEMARK OFFICE
CERTIFICATE OF CORRECTION

PATENT NO. : 5,354,632           Page 1 of 2
DATED      : October 11, 1994
INVENTOR(S) : Giang T. Dao, Kenny K.H. Toh, Eng T. Gaw, Rajeev R. Singh It is certified that error appears in the above-indentified patent and that said Letters Patent is hereby corrected as shown below:

On the title page, item [75], insert --California--following "all of"
Column 1; Line 14; Delete "an"; Insert in place thereof--art--
Column 1; Line 29; Delete "an"; Insert in place thereof--art--
Column 4; Line 22; Delete "dement"; Insert in place thereof--element--
Column 5; Line 5; Delete "an"; Insert in place thereof--art--
Column 5; Line 8; Delete "dement"; Insert in place thereof--element--
Column 5; Line 10; Delete "an"; Insert in place thereof--art--
Column 5; Line 19; Delete "an"; Insert in place thereof--art--
Column 6; Line 21; Delete "dement"; Insert in place thereof--element--
Column 6; Line 26; Delete "dement"; Insert in place thereof--element-
Column 6; Line 43; Delete "," after "III-V semiconductor"; Insert in place thereof--.--
Column 7; Line 10; Delete "fight"; Insert in place thereof--light--
Column 8; Line 8; Delete "an"
Column 9; Line 9; Delete "an"; Insert in place thereof--art--
Column 9; Line 22; Delete "dement"; Insert in place thereof--element--
Column 11; Line 23; Insert--)-- following "0.54 um"
Column 12; Line 29; Delete "an"; Insert in place thereof--art--
Column 12; Line 42: Delete "an"; Insert in place thereof--art--
Column 12; Line 47; Delete "an"; Insert in place thereof--art--
Column 12; Line 52; Delete "an"; Insert in place thereof--art--
Column 12; Line 54; Delete "0.5"; Insert in place thereof--0.51--
Column 12; Line 57; Delete "an"; Insert in place thereof--art--
Column 13; Line 3; Delete ","; Insert in place thereof--;--
Column 13; Line 7; Delete "fast"; Insert in place thereof--first--
Column 13; Line 8; Delete "fast"; Insert in place thereof--first--
Column 13; Line 10; Delete "fast"; Insert in place thereof--first--

UNITED STATES PATENT AND TRADEMARK OFFICE
CERTIFICATE OF CORRECTION

PATENT NO. : 5,354,632
DATED : October 11, 1994
INVENTOR(S) : Giang T. Dao, Kenny K.H. Toh, Eng T. Gaw, Rajeev R. Singh It is certified that error appears in the above-indentified patent and that said Letters Patent is hereby corrected as shown below:

Column 16; Line 9; Delete "fast"; Insert in place thereof --first--

Signed and Sealed this

Twenty-sixth Day of September, 1995

Attest:

BRUCE LEHMAN

Attesting Officer     Commissioner of Patents and Trademarks